(12) United States Patent
Taracila et al.

(10) Patent No.: US 8,704,610 B2
(45) Date of Patent: Apr. 22, 2014

(54) APPARATUS FOR IMPROVING GROUNDING FOR AN ELECTRICAL COMPONENT AND METHOD OF MAKING SAME

(75) Inventors: Victor Taracila, Beachwood, OH (US); Fraser John Laing Robb, Aurora, OH (US); Vijayanand Alagappan, Streetsboro, OH (US); Miguel Angel Navarro, II, Sheffield Village, OH (US); Peter Asuzu, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 358 days.

(21) Appl. No.: 13/195,707

(22) Filed: Aug. 1, 2011

(65) Prior Publication Data

US 2013/0033835 A1 Feb. 7, 2013

(51) Int. Cl.
*H03H 2/00* (2006.01)

(52) U.S. Cl.
USPC .............................. 333/24 R; 333/12; 333/244

(58) Field of Classification Search
USPC ........................ 333/12, 24 R, 244; 330/65–68
See application file for complete search history.

(56) References Cited

U.S. PATENT DOCUMENTS

| | | | | |
|---|---|---|---|---|
| 5,315,069 | A * | 5/1994 | Gebara | 174/250 |
| 5,412,340 | A * | 5/1995 | Tanikoshi | 330/68 |
| 6,458,547 | B1 * | 10/2002 | Bryan et al. | 506/9 |
| 6,603,376 | B1 * | 8/2003 | Handforth et al. | 333/238 |
| 6,774,748 | B1 * | 8/2004 | Ito et al. | 333/247 |
| 6,972,647 | B1 * | 12/2005 | Handforth et al. | 333/238 |

OTHER PUBLICATIONS

Grafendorfer et al., "Frequency Selective Negative Feedback to Avoid Preamplifier Oscillation in Multi-Channel Arrays," Proc. Intl. Soc, Mag. Reson. Med., Apr. 2010, p. 1.
Oppelt et al., "A Low Input Impedance MRI Preamplifier Using a Purely Capacitive Feedback Network," Proc. Intl. Soc. Mag. Reson. Med., vol. 14, 2006, p. 2026.

* cited by examiner

*Primary Examiner* — Robert Pascal
*Assistant Examiner* — Kimberly Glenn
(74) *Attorney, Agent, or Firm* — Ziolkowski Patent Solutions Group, SC

(57) ABSTRACT

A multi-layer cradle comprises a first layer comprising first and second contact pads configured to be electrically coupled to a signal input and a signal output of the electronic component, respectively. The first layer also comprises a first ground plane configured to be electrically coupled to a ground of the electronic component and a first fence positioned about the first ground plane. The first ground plane is positioned at least between the first and second contact pads. A second layer comprising a second ground plane is also included. The cradle further comprises a first dielectric material positioned between the first and second layers, a ground plane via extending through the first dielectric material and electrically coupled to the first and second ground planes, and a plurality of fence vias extending through the first dielectric material and electrically coupled to the first fence and to second ground plane.

20 Claims, 4 Drawing Sheets ated for carrying out the invention.

APPARATUS FOR IMPROVING GROUNDING FOR AN ELECTRICAL COMPONENT AND METHOD OF MAKING SAME

BACKGROUND OF THE INVENTION

Embodiments of the invention relate generally to an MRI preamplifier and, more particularly, to an apparatus for improving the grounding of the preamplifier and method of making same.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

In modern MRI phased array coils, the preamplifiers are placed near the receiving antennas. In general, the close proximity attempts to overcome fast signal-to-noise (SNR) degradation along the transmission lines and inherently weak signals coming from human body. Methods of reducing SNR degradation include amplifying the signal received by a receiving antenna by the preamplifier very close to the antenna output. Thus, a feedboard containing the preamplifier may be coupled directly to the antenna output. Moving the preamplifier close to the receiving antenna also tends to increase decoupling between receive elements.

However, moving the preamplifier close to the receiving antenna tends to make grounding of the preamplifier difficult to control. The preamplifier function is affected by its grounding. Hence, a good ground can positively affect the function of the amplifier, and a poor ground can negatively affect the function of the amplifier.

Generally, when the S12 of an empty feedboard is higher than the S12 of the stand-alone preamplifier such as, for example, what may occur when the S12 of the preamplifier is significantly low to have its μ-parameter higher than unity, the preamplifier's stability is affected. In high density coils, where RF components and cables are in close proximity to each other, the coil feedback (S12 or S21) between input and output of the preamplifier can reach high values that cause oscillations.

It would therefore be desirable to have an apparatus capable of stabilizing the grounding for MRI preamplifiers to reduce or eliminate the aforementioned drawbacks.

BRIEF DESCRIPTION OF THE INVENTION

In accordance with one aspect of the invention, a multi-layer cradle for an electronic component comprises a first layer comprising a first contact pad configured to be electrically coupled to a signal input of the electronic component and a second contact pad configured to be electrically coupled to a signal output of the electronic component. The first layer also comprises a first ground plane configured to be electrically coupled to a ground of the electronic component and a first fence positioned about the first ground plane. The first ground plane is positioned at least between the first and second contact pads. A second layer comprising a second ground plane is also included. The cradle further comprises a first dielectric material positioned between the first and second layers, a ground plane via extending through the first dielectric material and electrically coupled to the first and second ground planes, and a plurality of fence vias extending through the first dielectric material and electrically coupled to the first fence and to second ground plane.

In accordance with another aspect of the invention, a method of manufacturing a multi-layer cradle comprises forming a first layer of the multi-layer cradle comprising forming a pair of contacts configured to be coupled to an electronic component, forming a ground plane at least between the pair of contacts, and forming a fence adjacently to the ground plane of the first layer. The ground plane of the first layer is configured to be coupled to the electronic component. The method also comprises forming a first layer of the multi-layer cradle comprising forming a ground plane and forming a plurality of vias through at least one dielectric layer separating the first and second layers. The method further comprises coupling a first via of the plurality of vias to the ground plane of the first layer and to the ground plane of the second layer and coupling a remainder of the plurality of vias to the fence of the first layer and to the ground plane of the second layer.

In accordance with yet another aspect of the invention, a feedboard for an RF coil apparatus comprises a printed circuit board (PCB) comprising a plurality of dielectric layers, a capacitor attached to the PCB and coupled to an RF coil input contact pad formed on the PCB, a balun attached to the PCB and coupled to the capacitor, an amplifier attached to the PCB and coupled to the balun, and a multi-layer cradle formed in the PCB. The cradle comprises a first layer comprising a first signal contact coupled to a signal input of the amplifier, a second signal contact coupled to a signal output of the amplifier, a ground plane extending at least between the first and second signal contacts and coupled to a ground of the amplifier, and a plurality of fence portions positioned about the ground plane of the first layer. The cradle also comprises a second layer separated from the first layer by at least one of the plurality of dielectric layers. The second layer comprises a ground plane and a fence surrounding the ground plane of the second layer. The cradle further comprises a third layer separated from the second layer by at least another one of the plurality of dielectric layers; a plurality of fence vias extending through the plurality of dielectric layers and coupled to the plurality of fence portions of the first layer, to the fence of the third layer, and to the ground plane of the third layer; and a ground plane via extending through the plurality of dielectric layers and coupled to the ground planes of the first, second, and third layers. The third layer comprises a ground plane.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
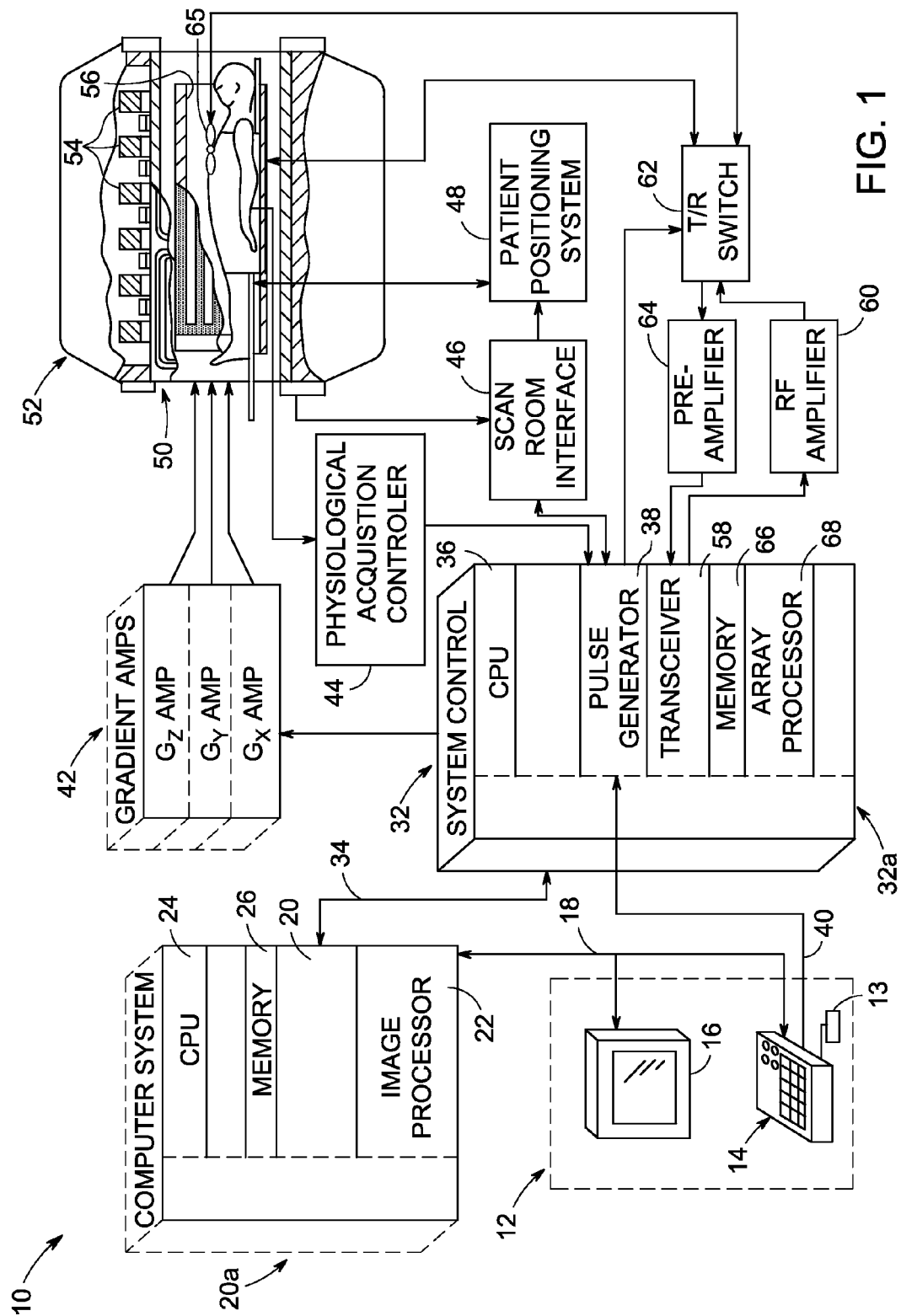
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56 that, according to an exemplary embodiment of the invention, functions as a transmit coil to generate a transverse RF magnetic field (excitation field $B_1$) which is in the x-y plane. A transceiver module 58 in the system control 32 produces pulses which are amplified by an RF amplifier 60 and coupled to the transmit coil 56 by a transmit/receive switch 62. The resulting signals emitted by the excited nuclei in the patient may be sensed by a separate array of RF receiver coils 65, such a phased array of coils, for example, and coupled through a preamplifier 64 to the transmit/receive switch 62. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode.

The MR signals picked up by the array of receive coils 65 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
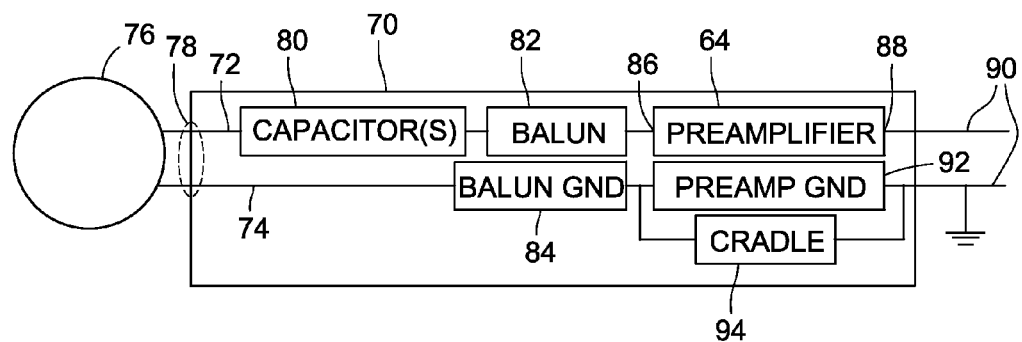
FIG. 2 is a block diagram of an MRI feedboard according to an embodiment of the invention.

FIG. 2 illustrates a block diagram of an MRI feedboard 70 according to an embodiment of the invention. Feedboard 70 is preferably a multi-layer printed circuit board (PCB) and includes a signal line 72 and a ground line 74 coupled to a phased array coil 76 such as a coil from the array of RF receiver coils 65 illustrated in FIG. 1. According to an embodiment of the invention, signal line 72 and ground line 74 are directly coupled to coil 76 at an input 78 of feedboard 70. Lines 72-74 preferably form a transmission line for conducting RF and ground signals from coil 76 throughout feedboard 70. When lines 72-74 are formed as a microstrip transmission line, at least two PCB layers are used to form feedboard 70. When lines 72-74 are formed as a stripline transmission line, at least three PCB layers are used to form feedboard 70.

One or more capacitors 80 may be coupled in series with signal line 72. Capacitor 80 may be, for example, a matching capacitor configured to provide a matching between coil 76 and feedboard 70. Another capacitor may be included to provide pre-dump functionality. Feedboard 70 includes a balun 82 coupled to signal line 72 and having a balun ground 84 coupled to ground line 74. Balun 82 couples capacitor(s) 80 to a signal input 86 of preamplifier 64 of FIG. 1. A signal output 88 of preamplifier 64 is coupled to T/R switch 62 of FIG. 1 via a transmission line 90. As shown, preamplifier 64 also includes a preamplifier ground 92 coupled to ground line 74.

According to an embodiment of the invention, a passive grounding cradle 94 coupled to ground line 74 is formed in feedboard 70 so as to be adjacent to preamplifier ground 92. Cradle 94 is configured to shield preamplifier ground 92 from RF signals. In this manner, control and stabilization of the grounding of preamplifier 64 is increased. FIGS. 3-6 describe one embodiment of cradle 94 in more detail.

Figure 3:
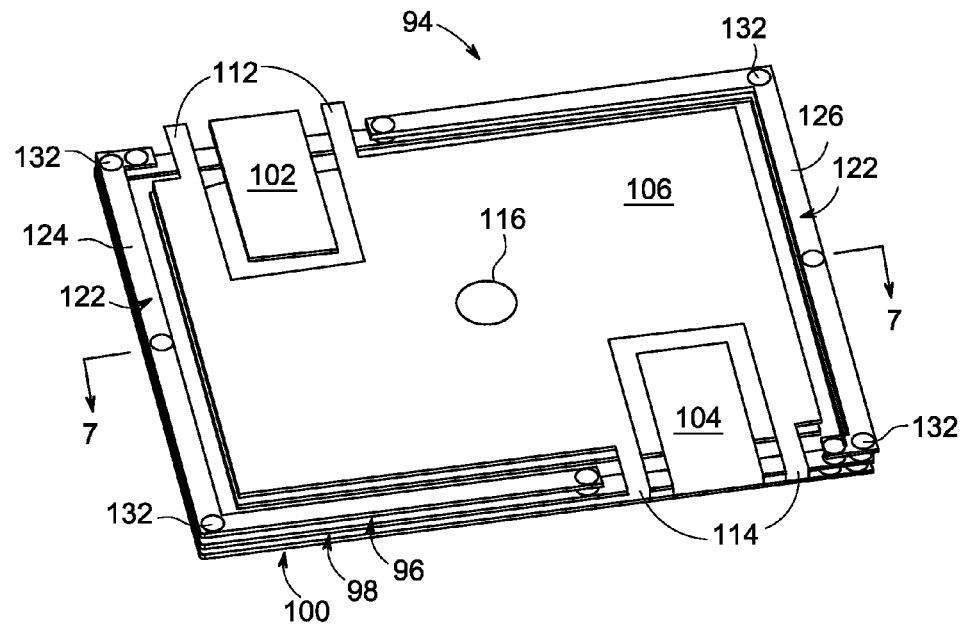
FIG. 3 is an isometric view of a multi-layer electronic component cradle according to an embodiment of the invention.

As illustrated in FIG. 3, an isometric view of cradle 94 is shown according to an embodiment of the invention. While described herein as a cradle for preamplifier 64, it is understood that cradle 94 may be designed for any electronic component. As shown, cradle 94 may be a multi-layer cradle for an electronic component having a top layer 96, one or more sub-layers 98, and a bottom layer 100 stacked in line with one another. Each layer 96-100 is formed on a distinct PCB layer of feedboard 70. It is contemplated, however, that cradle 94 may not include a sub-layer such as sub-layer 98 and that only a top layer 96 and a bottom layer 100 may form a complete cradle 94. For example, sub-layer 98 may be eliminated when configuring signal line 72 and ground line 74 as a microstrip transmission line for feedboard 70 as described above. However, the details of cradle 94 will be described with respect to a cradle having at least one sub-layer in addition to the top and bottom layers.

Figure 4:
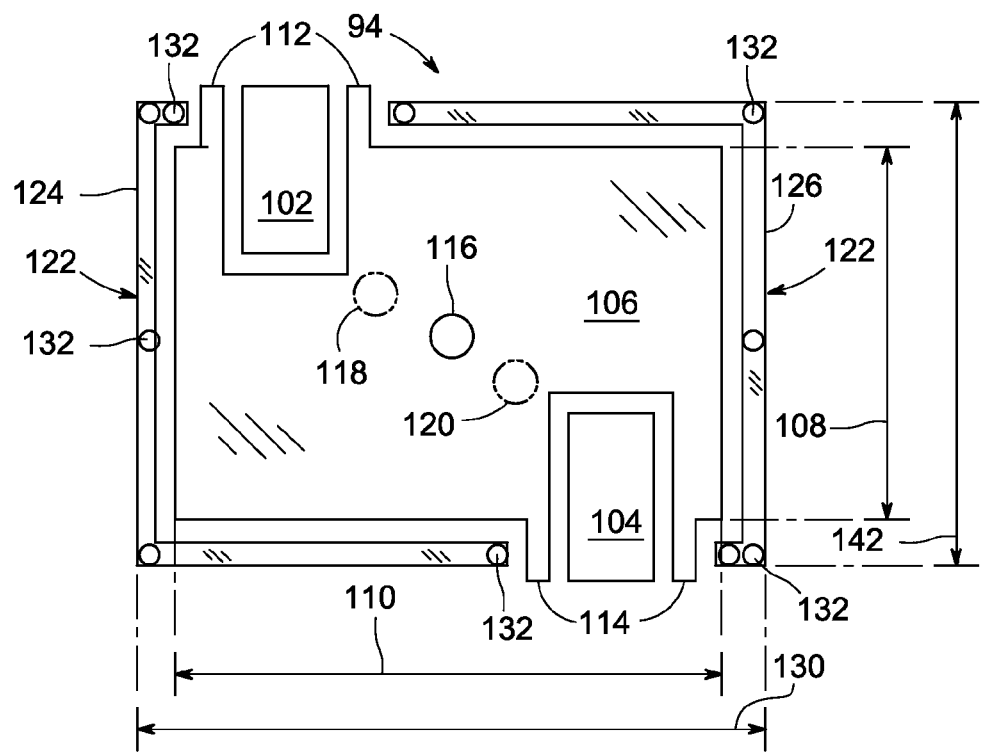
FIG. 4 is a plan view of a top layer of the multi-layer cradle of FIG. 3 according to an embodiment of the invention.

FIG. 4 shows a plan view of top layer 96 of cradle 94 according to an embodiment of the invention. Referring to FIGS. 3 and 4, top layer 96 includes a pair of contacts or contact pads 102, 104 to which signal input 86 and signal output 88 of preamplifier 64 are coupled during assembly of feedboard 70. A ground plane 106 having a width 108 and a length 110 is positioned adjacently to and between contacts 102, 104. Ground plane 106 includes a pair of inputs 112 and a pair of outputs 114 coupleable to ground line 74. Ground plane 106 is coupleable to preamplifier ground 92 at or between inputs 112 and outputs 114.

A via 116 is coupled to ground plane 106 and, with respect to DC, is configured to electrically couple ground plane 106 of top layer 96 to the ground planes of sub-layer(s) 98 and bottom layer 100 as shown in FIGS. 3-6. As illustrated, via 116 is centrally positioned in ground plane 106, which adds some amount of inductive impedance. However, moving via 116 away from the center and toward, for example, either position 118 or 120 increases the inductive impedance. Positions 118 or 120 place via 116, for example, closer to contacts 102, 104 or closer to an edge of ground plane 106 than to the center of ground plane 106.

A fence 122 comprising a pair of fence portions 124, 126 on top layer 96 is positioned about ground plane 106. Fence 122 has a width 128 and a length 130 that are each greater than the width 108 and length 110 of ground plane 106, respectively. In an embodiment of the invention, fence 122 surrounds a majority of ground plane 106 such that ground plane 106 is positioned completely with the perimeter formed by width 128 and length 130 of fence 122. With respect to DC, fence 122 is not electrically coupled to ground plane 106 within top layer 96 but is electrically coupled thereto by way of a plurality of vias 132 extending to the ground plane of bottom layer 100 as shown in FIGS. 3-6 and by way of via 116 also extending to the ground plane of bottom layer 100. While FIGS. 3-6 show ten vias 132, embodiments of the invention may include more or fewer vias. For example, when used in an MRI system at 3T, one design strategy may include positioning one via 116 every 10 mm along fence 122. Fence 122 acts to enforce a low conductance on the edges of ground plane 106 such that edge currents thereon are reduced or eliminated.

Figure 5:
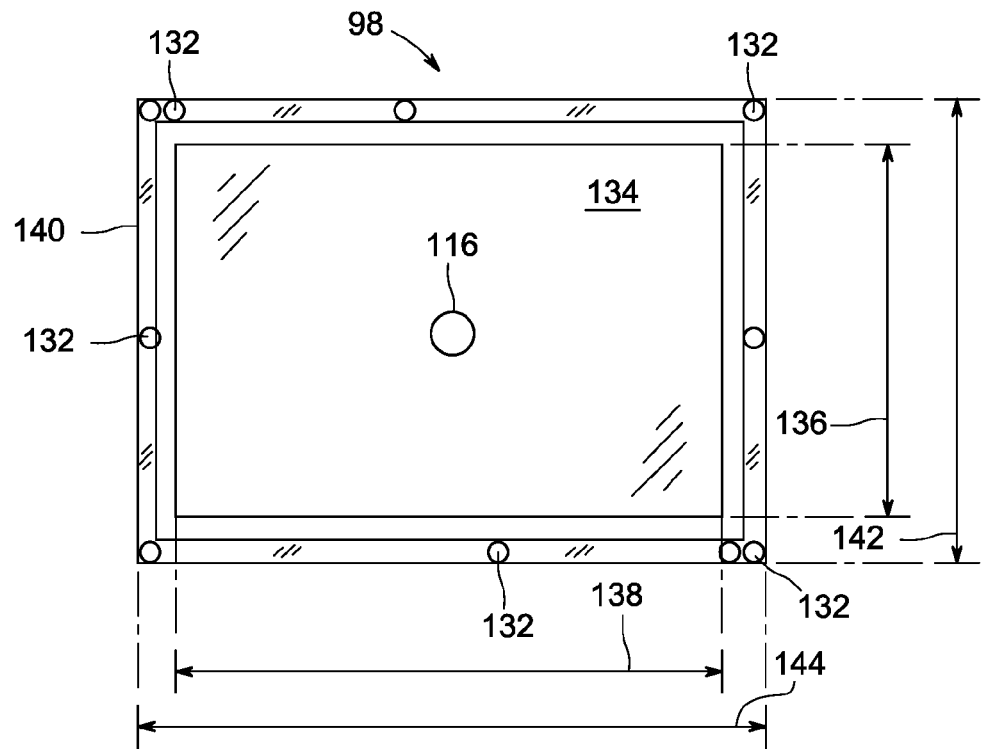
FIG. 5 is a plan view of a sub-layer of the multi-layer cradle of FIG. 3 according to an embodiment of the invention.

FIG. 5 shows a plan view of one sub-layer 98 of cradle 94 according to an embodiment of the invention. Sub-layer 98 includes a ground plane 134 coupled to via 116, which electrically couples ground plane 134 to ground plane 106 of top layer 96 and to the ground plane of bottom layer 100 with respect to DC. Ground plane 134 has a width 136 and a length 138 and is positioned so as to overlap ground plane 106. In one embodiment of the invention, width 136 is substantially equal to width 108, and length 138 is substantially equal to length 110.

A fence 140 having a width 142 and a length 144 is positioned adjacently to ground plane 134. In one embodiment, the width 136 and length 138 of ground plane 134 are each less than the respective width 142 and length 144 of fence 140 such that ground plane 134 is completely surrounded by fence 140 on sub-layer 98. Similar to fence 122, fence 140 acts to enforce a low conductance on the edges of ground plane 134 such that edge currents thereon are reduced or eliminated. Fence 140 is coupled to fence 122 and to bottom layer 100 with respect to DC through vias 132. Also, while fence 140 is not electrically coupled to ground plane 134 through a connection within sub-layer 98, it is coupled thereto by way of vias 116, 132. In one embodiment, fence 140 is positioned so as to overlap fence 122.

Figure 6:
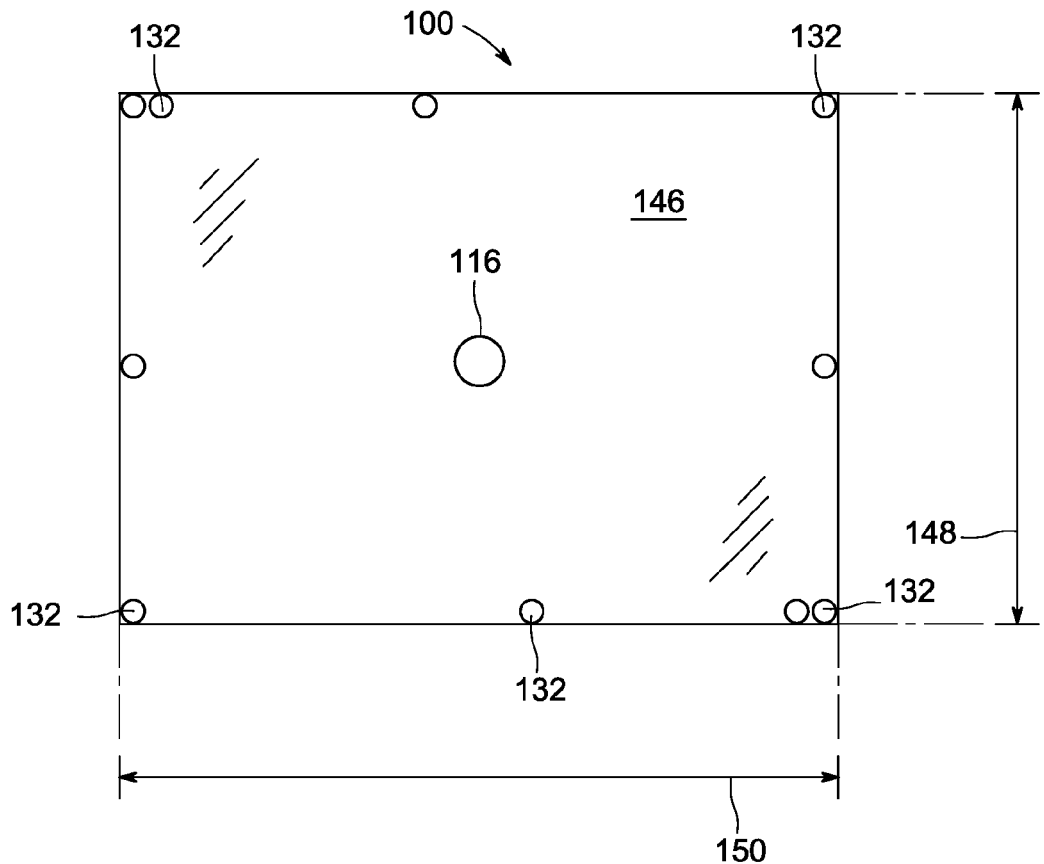
FIG. 6 is a plan view of a bottom layer of the multi-layer cradle of FIG. 3 according to an embodiment of the invention.

FIG. 6 shows a plan view of bottom layer 100 according to an embodiment of the invention. Bottom layer 100 includes a ground plane 146 electrically coupled to vias 116 and 132 and hence, to top layer 96, sub-layer(s) 98, and fences 122, 140 with respect to DC. Ground plane 146 has a width 148 and a length 150, and in one embodiment, is positioned so as to overlap ground planes 106, 134 as well as fences 122, 140. In this embodiment, the width 148 and length 150 of ground plane 146 substantially match the respective width 142 and length 144 of fence 140.

Figure 7:
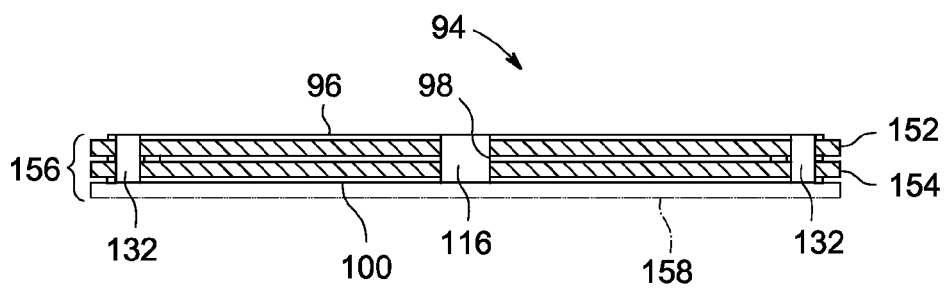
FIG. 7 is a cross-sectional view of the multi-layer cradle taken along line 7-7 of FIG. 3 according to an embodiment of the invention.

FIG. 7 illustrates a cross-sectional view of the multi-layer cradle taken along line 7-7 of FIG. 3 together with PCB construction according to an embodiment of the invention. Top layer 96, sub-layer(s) 98, and bottom layer 100 are formed on different surfaces of a plurality of dielectric material layers 152, 154 of a multi-layer PCB 156. Multi-layer PCB 156 may be rigid or flexible, and each cradle layer 96-110 is separated from an adjacent cradle layer via the dielectric material of layers 152, 154. Vias 116 and 132, described above as coupling various components of each layer 96-110 to other components of other layers 96-110 are formed through the dielectric material of layers 152, 154. In one embodiment, PCB 156 may form the entire feedboard 70 of FIG. 3.

According to another embodiment of the invention, PCB 156 includes a third dielectric material layer 158 (shown in phantom) on which bottom layer 100 is formed.

As described above, a preamplifier such as preamplifier 64 is coupled during assembly to contacts 102, 104 and to ground plane 106 of cradle 94. The preamplifier itself is made up of many components that are connected to the relatively large surface area of ground plane 106, which, being relatively large, typically has at least some surface currents on the underneath side (i.e., the side opposite to the one coupled to the preamplifier components). The passive hardware cradle design according to embodiments of the invention described herein acts to diminish that ground current by connecting it to a current sink. Thus, ground currents on the underneath side, which would spuriously appear on one edge of the ground, are attracted toward the sink instead of being attracted toward the other edge. The sink is realized through one single via (such as via 116) that connects the top ground plane (such as ground plane 106) to the outside metallic structures (such as fence 122). Because undesired ground currents are drawn toward the current sink, preamplifier oscillations are reduced, thus increasing the stability of the preamplifier. With an increase in stability of the preamplifier, coil feedback is also reduced, thus increasing the stability of the RF coil. According to embodiments of the invention, the coil feedback may be reduced by at least 20 dB.

Therefore, according to an embodiment of the invention, a multi-layer cradle for an electronic component comprises a first layer comprising a first contact pad configured to be electrically coupled to a signal input of the electronic component and a second contact pad configured to be electrically coupled to a signal output of the electronic component. The first layer also comprises a first ground plane configured to be electrically coupled to a ground of the electronic component and a first fence positioned about the first ground plane. The first ground plane is positioned at least between the first and second contact pads. A second layer comprising a second ground plane is also included. The cradle further comprises a first dielectric material positioned between the first and second layers, a ground plane via extending through the first dielectric material and electrically coupled to the first and second ground planes, and a plurality of fence vias extending through the first dielectric material and electrically coupled to the first fence and to second ground plane.

According to another embodiment of the invention, a method of manufacturing a multi-layer cradle comprises forming a first layer of the multi-layer cradle comprising forming a pair of contacts configured to be coupled to an electronic component, forming a ground plane at least between the pair of contacts, and forming a fence adjacently to the ground plane of the first layer. The ground plane of the first layer is configured to be coupled to the electronic component. The method also comprises forming a first layer of the multi-layer cradle comprising forming a ground plane and forming a plurality of vias through at least one dielectric layer separating the first and second layers. The method further comprises coupling a first via of the plurality of vias to the ground plane of the first layer and to the ground plane of the second layer and coupling a remainder of the plurality of vias to the fence of the first layer and to the ground plane of the second layer.

According to yet another embodiment of the invention, a feedboard for an RF coil apparatus comprises a printed circuit board (PCB) comprising a plurality of dielectric layers, a capacitor attached to the PCB and coupled to an RF coil input contact pad formed on the PCB, a balun attached to the PCB and coupled to the capacitor, an amplifier attached to the PCB and coupled to the balun, and a multi-layer cradle formed in the PCB. The cradle comprises a first layer comprising a first signal contact coupled to a signal input of the amplifier, a second signal contact coupled to a signal output of the amplifier, a ground plane extending at least between the first and second signal contacts and coupled to a ground of the amplifier, and a plurality of fence portions positioned about the ground plane of the first layer. The cradle also comprises a second layer separated from the first layer by at least one of the plurality of dielectric layers. The second layer comprises a ground plane and a fence surrounding the ground plane of the second layer. The cradle further comprises a third layer separated from the second layer by at least another one of the plurality of dielectric layers; a plurality of fence vias extending through the plurality of dielectric layers and coupled to the plurality of fence portions of the first layer, to the fence of the third layer, and to the ground plane of the third layer; and a ground plane via extending through the plurality of dielectric layers and coupled to the ground planes of the first, second, and third layers. The third layer comprises a ground plane.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A multi-layer cradle for an electronic component, the cradle comprising:
    a first layer comprising:
        a first contact pad configured to be electrically coupled to a signal input of the electronic component;
        a second contact pad configured to be electrically coupled to a signal output of the electronic component;
        a first ground plane configured to be electrically coupled to a ground of the electronic component, the first ground plane positioned at least between the first and second contact pads; and
        a first fence positioned about the first ground plane;
    a second layer comprising a second ground plane;
    a first dielectric material positioned between the first and second layers;
    a ground plane via extending through the first dielectric material and electrically coupled to the first and second ground planes; and
    a plurality of fence vias extending through the first dielectric material and electrically coupled to the first fence and to second ground plane.

2. The cradle of claim 1 wherein the first ground plane is electrically decoupled from the first and second contact pads.

3. The cradle of claim 1 wherein a width and a length of the first ground plane are less than a width and a length of the first fence, respectively.

4. The cradle of claim 3 wherein a width and a length of the second ground plane are substantially equal to the width and length of the first fence, respectively.

5. The cradle of claim 1 wherein the ground plane via is centrally positioned within the first ground plane.

6. The cradle of claim 1 wherein the ground plane via is positioned within the first ground plane closer to an edge of the first ground plane than to a center of the first ground plane.

7. The cradle of claim 1 further comprising:
    a second dielectric material positioned between the first and second layers;
    a third layer positioned between the first dielectric material and the second dielectric material, the third layer comprising:
        a third ground plane; and
        a second fence positioned about the third ground plane;
    wherein the ground plane via further extends through the third ground plane and second dielectric material and is further electrically coupled to the third ground plane; and
    wherein the plurality of fence vias further extends through the second fence and the second dielectric material and is further electrically coupled to the second fence.

8. The cradle of claim 7 wherein the second fence completely surrounds the third ground plane.

9. The cradle of claim 1 wherein the first layer further comprises:
    a pair of signal ground inputs extending from the first ground plane; and a pair of signal ground outputs extending from the first ground plane.

10. The cradle of claim 9 wherein the first contact pad and the pair of signal ground inputs extend beyond a first side of the first ground plane; and wherein the second contact pad and the pair of signal ground outputs extend beyond a second side of the first ground plane, the second side opposite the first side.

11. A method of manufacturing a multi-layer cradle comprising:

forming a first layer of the multi-layer cradle comprising:
forming a pair of contacts configured to be coupled to an electronic component;
forming a ground plane at least between the pair of contacts, the ground plane of the first layer configured to be coupled to the electronic component; and
forming a fence adjacently to the ground plane of the first layer;
forming a first layer of the multi-layer cradle comprising forming a ground plane;
forming a plurality of vias through at least one dielectric layer separating the first and second layers;
coupling a first via of the plurality of vias to the ground plane of the first layer and to the ground plane of the second layer; and
coupling a remainder of the plurality of vias to the fence of the first layer and to the ground plane of the second layer.

12. The method of claim 11 further comprising:
forming a third layer of the multi-layer cradle between the first and second layers and comprising:
forming a ground plane; and
forming a fence adjacently to the ground plane of the third layer;
coupling the first via of the plurality of vias to the ground plane of the third layer; and
coupling the remainder of the plurality of vias to the fence of the third layer.

13. The method of claim 12 wherein forming the fence of the third layer comprises forming the fence of the third layer to completely surround the ground plane of the third layer.

14. The method of claim 12 wherein forming the fence of the third layer comprises forming the fence of the third layer to have substantially a same width and substantially a same length as a width and a length, respectively, of the fence of the first layer.

15. The method of claim 11 wherein coupling the first via comprises coupling the first via to a center of the ground plane of the first layer and to a center of the ground plane of the second layer.

16. A feedboard for an RF coil apparatus comprising:
a printed circuit board (PCB) comprising a plurality of dielectric layers;
a capacitor attached to the PCB and coupled to an RF coil input contact pad formed on the PCB;
a balun attached to the PCB and coupled to the capacitor;
an amplifier attached to the PCB and coupled to the balun;
a multi-layer cradle formed in the PCB and comprising:
a first layer comprising:
a first signal contact coupled to a signal input of the amplifier;
a second signal contact coupled to a signal output of the amplifier;
a ground plane extending at least between the first and second signal contacts and coupled to a ground of the amplifier; and
a plurality of fence portions positioned about the ground plane of the first layer;
a second layer separated from the first layer by at least one of the plurality of dielectric layers, the second layer comprising:
a ground plane; and
a fence surrounding the ground plane of the second layer;
a third layer separated from the second layer by at least another one of the plurality of dielectric layers, the third layer comprising a ground plane;
a plurality of fence vias extending through the plurality of dielectric layers and coupled to the plurality of fence portions of the first layer, to the fence of the second layer, and to the ground plane of the third layer; and
a ground plane via extending through the plurality of dielectric layers and coupled to the ground planes of the first, second, and third layers.

17. The feedboard of claim 16 wherein a diameter of the ground plane via is larger than a diameter of any of the plurality of fence vias.

18. The feedboard of claim 16 wherein the ground plane via is positioned in a center of the ground plane of the first layer.

19. The feedboard of claim 16 wherein the ground plane via is positioned closer to one of the first signal contact and the second signal contact than to a center of the ground plane of the first layer.

20. The feedboard of claim 16 wherein the ground plane of the first layer is only coupled to the plurality of fence portions of the first layer by way of the ground plane via and the plurality of fence vias; and wherein the ground plane of the second layer is only coupled to the fence of the second layer by way of the ground plane via and the plurality of fence vias.

* * * * *